US005939965A

United States Patent [19]

Esguerra et al.

[11] Patent Number: 5,939,965

[45] **Date of Patent: *Aug. 17, 1999**

[54] INDUCTIVE COMPONENT WITH VARIABLE MAGNETIC PERFORMANCE

[75] Inventors: Mauricio Esguerra, Unterhaching; Helko Meuche, München, both of Germany

[73] Assignee: Siemens Matsushita Components GmbH & Co. KG, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/816,828

[22] Filed: Mar. 18, 1997

[30] Foreign Application Priority Data

Mar. 18, 1996 [DE] Germany .......................... 196 10 541

[51] Int. Cl.[6] .............................. H03H 5/00; H03H 7/00; H01F 27/00

[52] U.S. Cl. ......................... 336/100; 333/177; 333/24 R

[58] Field of Search ................................ 333/24 R, 177, 333/181, 185; 336/100

[56] References Cited

U.S. PATENT DOCUMENTS

| | | | |
|---|---|---|---|
| 3,509,498 | 4/1970 | Chanteloup | 333/31 |
| 4,236,200 | 11/1980 | Imai et al. | 363/135 |
| 4,456,900 | 6/1984 | Toyoshima et al. | 336/221 |
| 5,015,975 | 5/1991 | Okubo | 333/181 |
| 5,374,907 | 12/1994 | Orita et al. | 333/181 |

FOREIGN PATENT DOCUMENTS 2 100 935 1/1983 United Kingdom .

*Primary Examiner*—Michael L. Gellner
*Assistant Examiner*—Anh Mai
*Attorney, Agent, or Firm*—Herbert L. Lerner; Laurence A. Greenberg

[57] ABSTRACT

An inductive component with variable magnetic properties. A magnetic field is inductively generated in a magnetic core by an electrical winding. Electrode coatings are provided on the magnetic core and an electrical field or current is impressed into the magnetic core through the electrodes.

3 Claims, 5 Drawing Sheets

INDUCTIVE COMPONENT WITH VARIABLE MAGNETIC PERFORMANCE

BACKGROUND OF THE INVENTION

1. Field of the Invention

The present invention relates to an inductive component with variable magnetic performance, wherein an electric current is conducted through a winding and a magnetic field is generated in a magnetic core by the current flowing through the winding.

2. Description of the Related Art

It is known that the inductance of inductive components can be adapted, or in other words adjusted to a desired value after assembly, by mechanical or magnetic means. There are described, in "Ferritkerne - Grundlagen, Dimensionierung, Anwendungen in der Nachrichtentechnik" [Ferrite Cores-Fundamentals, Dimensioning, and Communications Applications] by S. Kampczyk and E. Röb, 1978, Siemens AG, pp. 266–268, variometers in which (similarly to the case of a rotary capacitor) the inductance can be adjusted continuously during operation to whatever value is desired. In such variometers, the inductance can be varied by factors by means of a magnetic field. It this kind of electromagnetic adaptation, the magnetic core of the inductive component is more or less premagnetized by means of a variable direct current flowing in an auxiliary winding. That is, this makes use of the phenomenon that the alternating field permeability (superposition permeability or reversible permeability) becomes less the greater the premagnetizing direct field.

Similar conditions prevail in the case of transductors, which are known for instance from "Enzyklopädie Naturwissenschaft und Technik" [Encyclopedia of Natural Sciences and Technology], 1961, Verlag Moderne Industrie, p. 4586. Those devices are controllable choke coils with nonlinear magnetic properties, which can be used in magnetic amplifiers, regulators, limiters, actuators, switches and converters. The fundamental element is a choke coil with at least one magnetic core, which contains in addition to the working winding at least one control winding as well. Once again, the properties of the transductor choke depend on the magnetization characteristic curve, whose nonlinearities are exploited. By magnetic saturation of the core material, an inductance of the working coil is obtained that is dependent on the magnetic flux. The magnetic flux is influenced not only by the current in the working windings but also via the current in the control windings.

SUMMARY OF THE INVENTION

It is accordingly an object of the invention to provide an inductive component with adaptable magnetic performance, which overcomes the above-mentioned disadvantages of the heretoforeknown devices and methods of this general type and which, while changing the inductance of inductive components only slightly, other parameters, and in particular their frequency response and loss performance, can be controlled in an advantageous manner.

With the foregoing and other objects in view there is provided, in accordance with the invention, an inductive component with variable magnetic performance, comprising:

at least one magnetic core and at least one winding, the winding conducting an electrical current therethrough for generating a magnetic field in the magnetic core; and means for impressing an electrical field or current into the magnetic core.

In accordance with an additional feature of the invention, the electrical field has a given frequency and the magnetic field has a frequency equal to the given frequency.

In accordance with another feature of the invention, the electrical field and the magnetic field have substantially identical amplitudes, and the amplitudes are defined by a common applied voltage.

In accordance with a further feature of the invention, the electrical field and the magnetic field have different amplitudes, and the different amplitudes are defined by mutually different voltages.

In accordance with an added feature of the invention, the means include metal electrode coatings disposed on the magnetic core and electrical terminals connected to the electrode coatings.

In accordance with yet an added feature of the invention, the electrical terminals also form the electrical terminals for the winding.

In accordance with yet another feature of the invention, the winding and the electrode coatings are connected in phase with the electrical terminals and the electrical field and the magnetic field are in phase with one another.

In the alternative, the electrical field and the magnetic field may be set to mutually different phases, and in particular mutually opposite phases. An expedient way to achieve the phase opposition is by connecting the winding and the electrode coatings at the electrical terminals in phase opposition.

Other features which are considered as characteristic for the invention are set forth in the appended claims.

Although the invention is illustrated and described herein as embodied in an inductive component with adaptable magnetic performance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
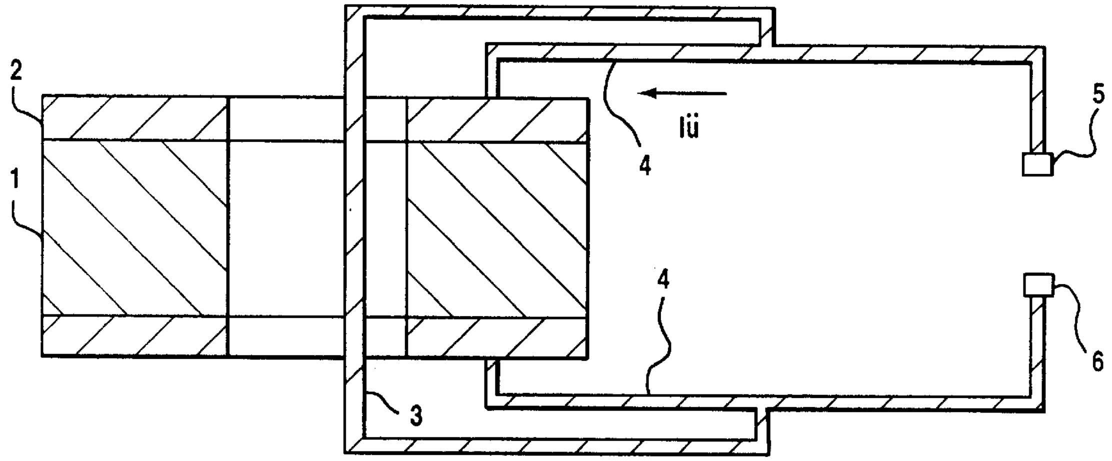
FIG. 1 is a schematic illustration of a first embodiment of an inductive component with adaptable magnetic performance.

The investigations on which the invention is based have shown that the magnetic performance of inductive components can also be influenced by electrical fields or currents imposed on the core material from their magnetic cores. In order to achieve this, an inductive component can be embodied according to the invention as illustrated in FIG. 1. The inductive component is formed by an magnetic core 1 and a winding 3 as is usual for inductive components. In the schematic illustration of FIG. 1, for the sake of simplicity, one annular core 1 and a single-turn winding 3 have been shown. It should be noted, however, that this simple illustration merely serves the purpose of explanation; that is, the provisions according to the invention can be applied to any type of inductive components, such as components with multi-part magnetic cores and multiple windings.

According to the invention, means for impressing an electrical field into the magnetic core 1 are now provided. As schematically illustrated in FIG. 1, the means for impressing an electrical field are embodied by metal electrode coatings 2 on the magnetic core 1 and electrical terminals 4 connected thereto. The electrical terminals 4 also serve as terminals for the winding 3 as well. An electrical current can be fed both into the winding 3 and into the electrode coatings 2 at terminals 5 and 6. The electrical current fed into the electrode coatings 2 is designated $I_o$ in FIG. 1.

In the embodiment of FIG. 1, the electrical terminals 4 for both the winding 3 and the electrode coatings 2 are connected in phase. By means of the currents fed into the electrode coatings 2 and the winding 3, an electrical field and a magnetic field are generated in the magnetic core 1. The fields are perpendicular to one another.

In the embodiment of FIG. 1, the electrical field and the magnetic field are of the same frequency and are in phase. Moreover, they have amplitudes that are determined by the common applied voltage. However, the invention is not limited to such an embodiment.

Figure 2:
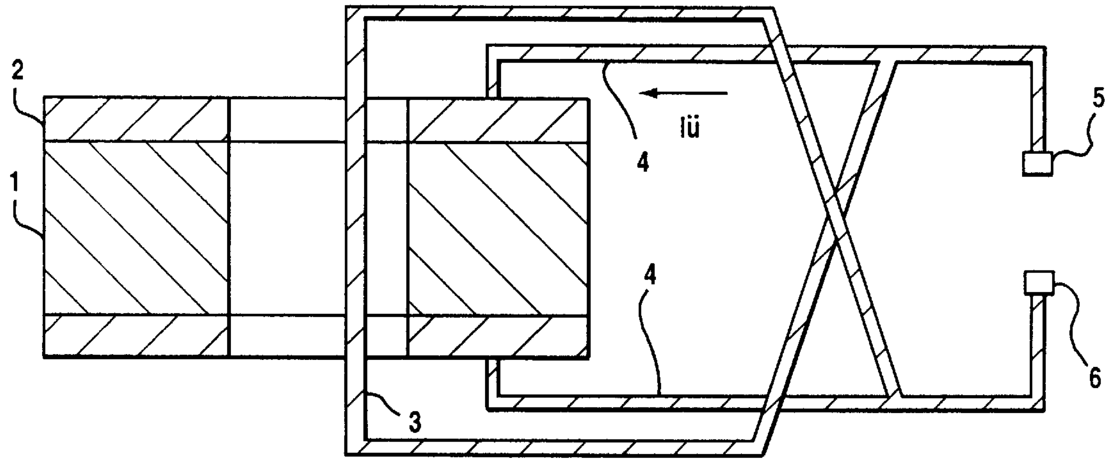
FIG. 2 is a similar view of a second embodiment of an inductive component with adaptable magnetic performance.

With reference to FIG. 2, in which elements identical to FIG. 1 are provided with the same reference numerals, the electrode coatings 2 and the winding 3 are connected in phase opposition via the electrical terminals 4. The result is a relative phase relationship of 180° between the electrical field and the magnetic field.

Along with the two phase relationships of 0° and 180° shown in FIGS. 1 and 2, a phase relationship between the electrical field and the magnetic field that varies over a range of 180° is naturally possible by means of suitable wiring means. The exact realization of such phase variation may be left to the person of skill in this art, as such wiring means have been known. Moreover, the layout shown schematically in FIGS. 1 and 2 may be expanded, by connecting non-illustrated amplifiers to the input side of the various circuits, so that an independent adjustment of the respective field amplitude is possible. An infinitely graduated phase displacement is also possible, in order to vary the superposition of the electrical field and magnetic field between the two extreme cases of "phase" and "phase opposition".

However, not only the permeability of inductive components can be adapted by the provisions of the invention.

Figure 3:
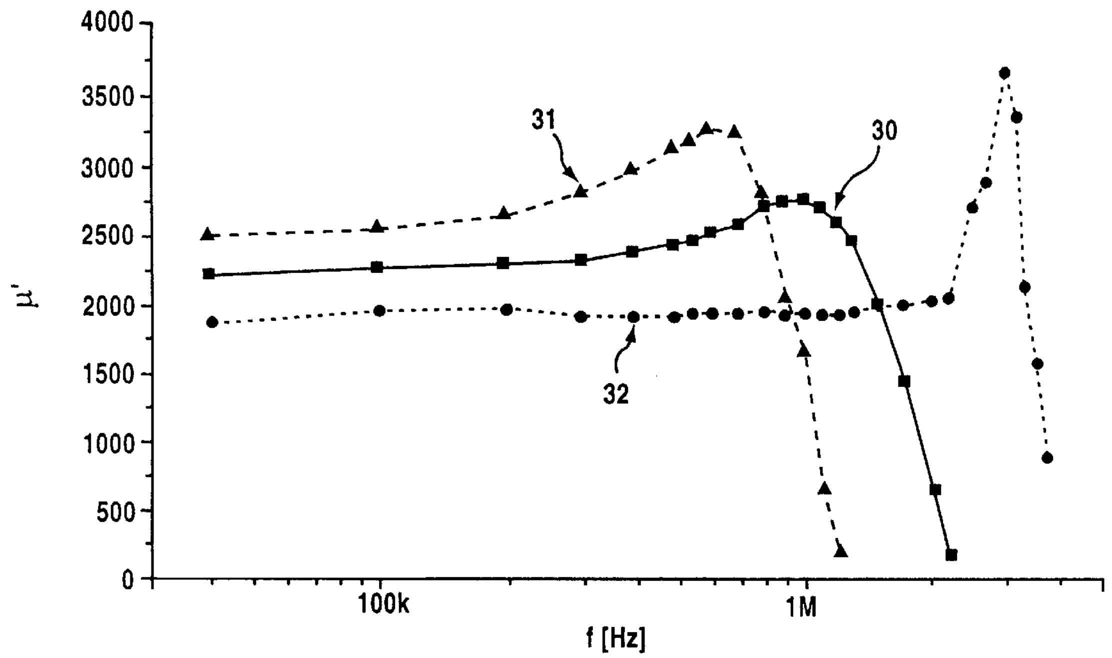
FIG. 3 is a graph of the initial permeability of an inductive component of the invention, as a function of the frequency.

With reference to the graph of FIG. 3, the frequency response of the permeability of inductive components can also be varied by superimposing an electrical field or current in the manner described above. In the graph of FIG. 3, the initial permeability $\mu'$ is plotted as a function of the frequency f in Hz. A curve 30 drawn as a solid line shows the course of the initial permeability $\mu'$ as a function of the frequency without superposition of an electrical field. A dashed-line curve 31 corresponding shows the course of the initial permeability $\mu'$ with phase-opposition superposition of an electrical field, while a dotted-line curve 32 shows the course of the initial permeability $\mu'$ for the case of in-phase superposition of an electrical field.

Figure 4:
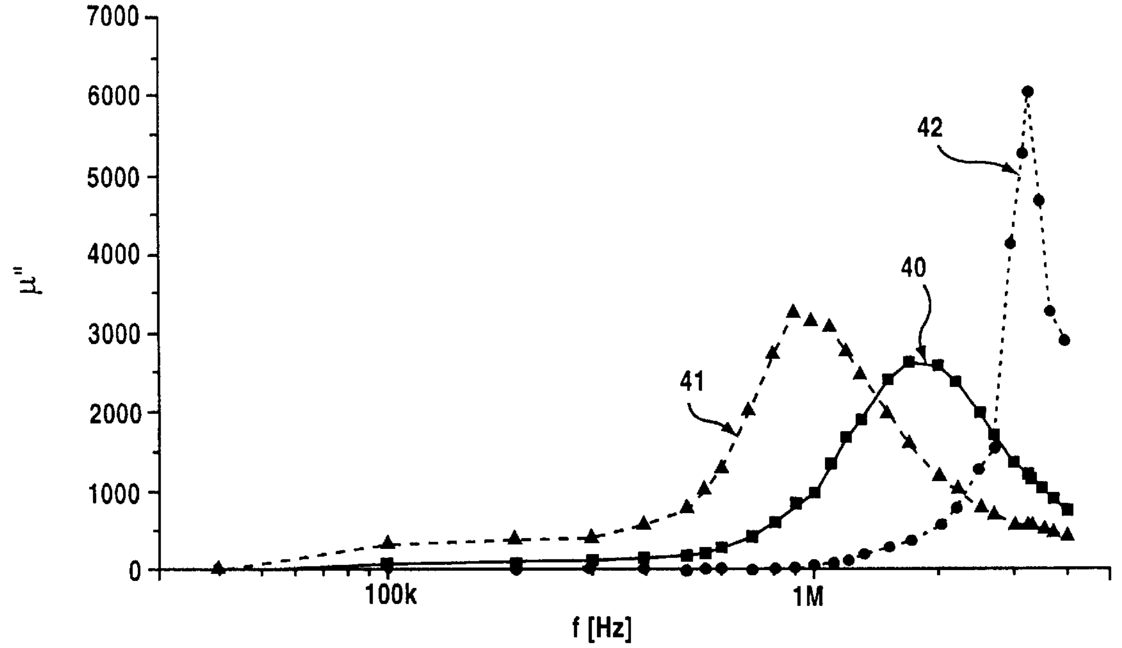
FIG. 4 is a graph of the ohmic resistor portion of the magnetic impedance of an inductive component according to the invention, as a function of frequency.

FIG. 4 shows a corresponding graph of the ohmic component of the magnetic impedance $\mu'$ as a function of the frequency f in Hz, with a solid curve 40, a dashed curve 41 and a dotted curve 42 indicating corresponding situations to the curves 30, 31, and 32 in FIG. 3.

Figure 5:
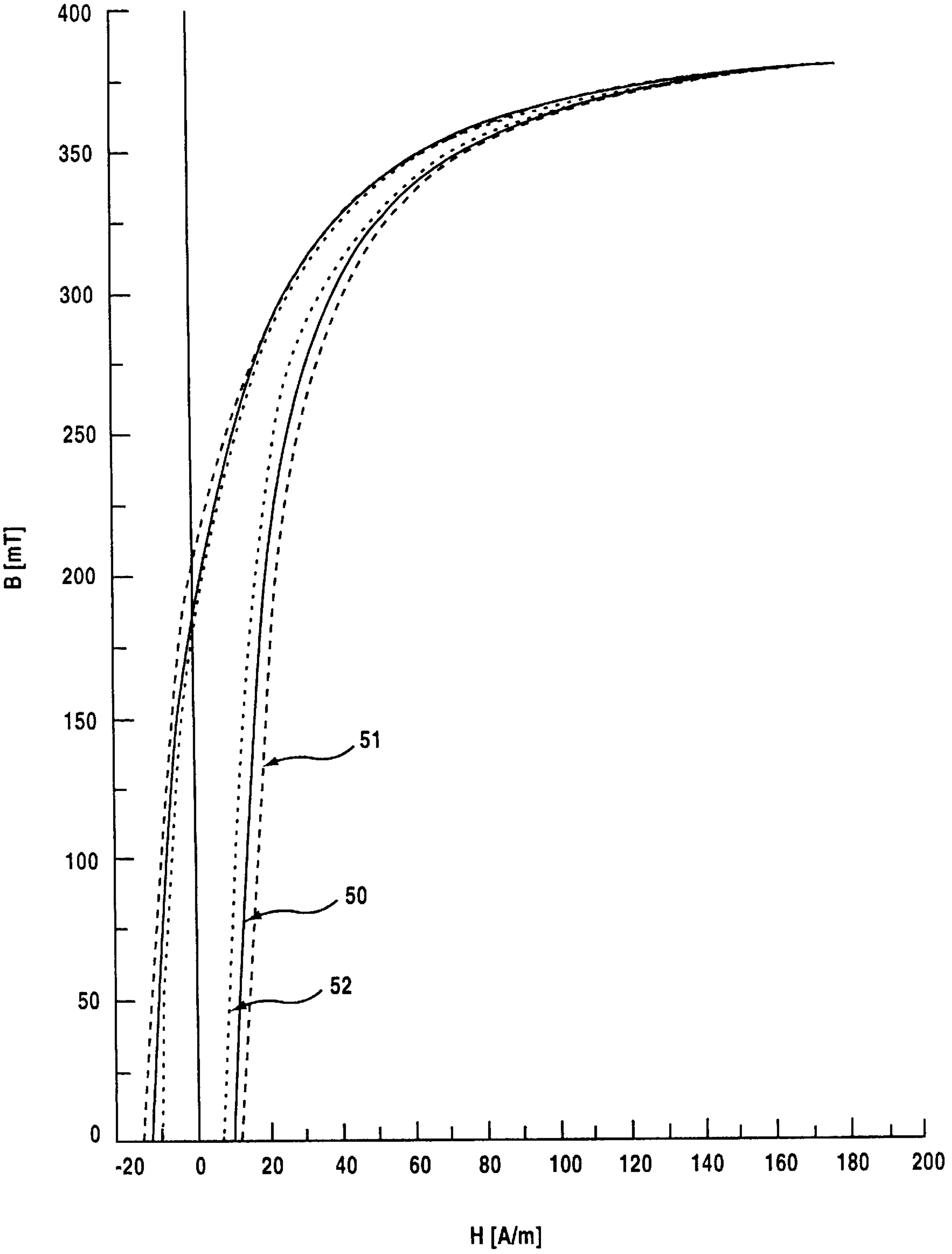
FIG. 5 is a graph of a hysteresis loop—magnetic induction as a function of the magnetic field—of an inductive component of the invention.

The graph of FIG. 5 shows the course of hysteresis loops, i.e., the magnetic induction B in mT as a function of the magnetic field intensity H in A/m. As in the graphs of FIGS. 3 and 4, a solid-line hysteresis loop 50 indicates the case without superposition of an electrical field; a dashed-line hysteresis loop 51 illustrates phase-opposition superposition of an electrical field; and a dotted-line loop 52 illustrates the case of in-phase superposition of an electrical field.

Figure 6:
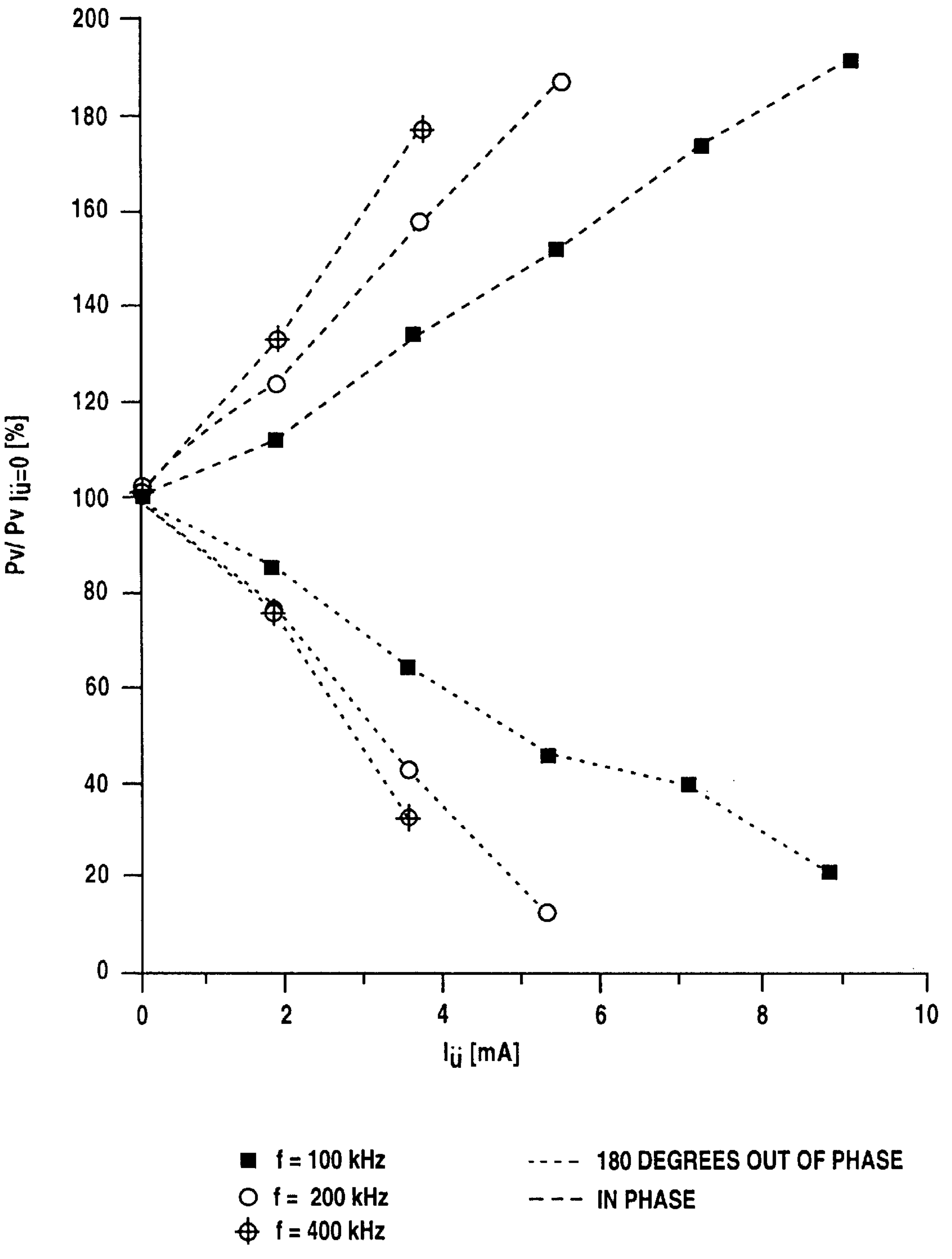
FIG. 6 is a graph of the relative power loss as a function of the superposition current in an inductive component of the invention.
Figure 7:
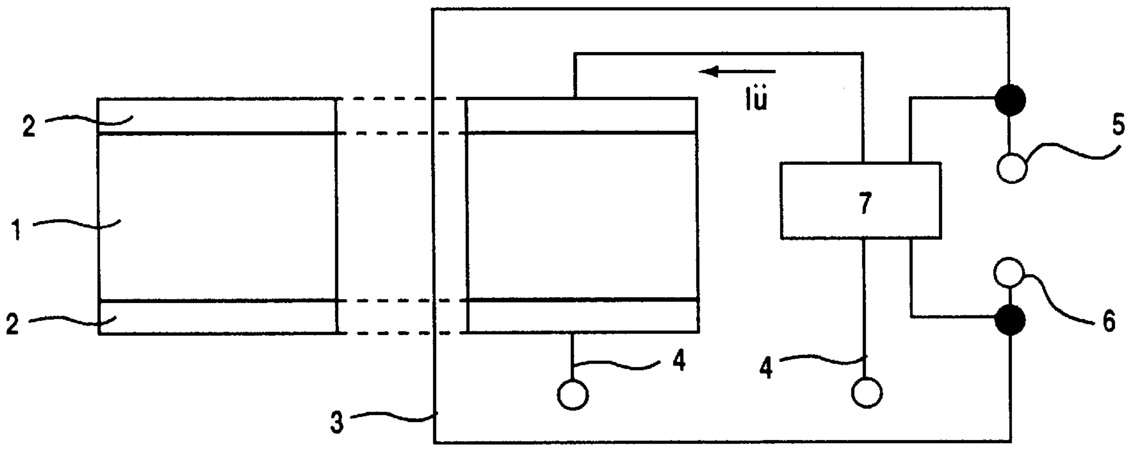
FIG. 7 is a schematic illustration of a third embodiment of an inductive component with adaptable magnetic performance.

Finally, the graph of FIG. 6 shows the relative power loss $P_v/P_{v_{I0=0}}$ in percent as a function of the superposition current $I_o$ in mA; $P_{v_{I0=0}}$ is the power loss without superposition of an electrical field. The various curves, whose parameter is the frequency f of 100, 200 and 400 kHz, are for the cases of phase-opposition superposition and in-phase superposition, as indicated in the caption to FIG. 6.

The superimposed electrical field does cause ohmic heating of the inductive component. However, it is possible to lower the total heat development, by comparison to the case without the electrical field, if the magnetic decrease in the power loss is greater than the ohmic output. The relationship can be optimized by way of the design of the component (geometry, material, windings), and of the superimposed field (directional orientation, amplitude, signal shape and/or phase).

In summary, the performance of inductive components can be controlled by superimposing electrical fields or currents. In contrast to magnetically controlled inductive components, it is here possible, in particular, to control the frequency response and the power loss performance as well, with only slight change in the material permeability or inductance of the component. The adjustment can be made by means of various parameters of the superimposed field, as indicated above.

We claim:

1. An inductive component with variable magnetic performance, comprising:

at least one magnetic core;

at least one winding disposed around said magnetic core for producing a magnetic field in said magnetic core, said magnetic field having an amplitude and a frequency;

means for impressing an electric field onto said magnetic core including at least two metallic electrode coatings disposed directly on said magnetic core and terminals connected to said electrode coatings, the electric field having an amplitude and a frequency equal to the frequency of the magnetic field;

means for adjusting a phase relationship between the electric field and the magnetic field from 0 to 180°; and means for independently adjusting the amplitude of one of the magnetic field and the electrical field.

2. The component according to claim 1, wherein said means for adjusting said phase relationship is set at 0° and includes an in-phase electrical connection of said winding to said electrode coatings.

3. The component according to claim 1, wherein said means for adjusting said phase relationship is set at 180° and includes a phase-opposition electrical connection of said winding to said electrode coatings.

* * * * *